(12) United States Patent
Naum et al.

(10) Patent No.: US 8,029,699 B2
(45) Date of Patent: Oct. 4, 2011

(54) ORANGE-YELLOW PHOSPHOR AND WARM WHITE LED USING THE SAME

(75) Inventors: Soshchin Naum, Changhua (TW); Wei-Hung Lo, Taipei (TW); Chi-Ruei Tsai, Taipei (TW)

(73) Assignee: Wei-Hung Lo, Taipei (TW)

( * ) Notice: Subject to any disclaimer, the term of this patent is extended or adjusted under 35 U.S.C. 154(b) by 399 days.

(21) Appl. No.: 12/068,557

(22) Filed: Feb. 7, 2008

(65) Prior Publication Data
US 2010/0032622 A1    Feb. 11, 2010

(30) Foreign Application Priority Data

Feb. 12, 2007    (TW) .............................. 96105022 A

(51) Int. Cl.
*C09K 11/79* (2006.01)
*C09K 11/86* (2006.01)
*C09K 11/80* (2006.01)

(52) U.S. Cl. .......... 252/301.4 F; 252/301.4 H; 428/404; 428/403

(58) Field of Classification Search ............ 252/301.4 F, 252/301.4 R, 301.4 H; 428/403, 404
See application file for complete search history.

(56) References Cited

U.S. PATENT DOCUMENTS

| 7,005,197 B2 * | 2/2006 | Shiiki et al. .................. 428/690 |
| 2006/0219927 A1 * | 10/2006 | Venkataramani et al. ........................ 250/370.11 |
| 2009/0152495 A1 * | 6/2009 | Naum et al. ............ 252/301.4 R |
| 2009/0179212 A1 * | 7/2009 | Naum et al. .................... 257/98 |

* cited by examiner

*Primary Examiner* — Carol M Koslow
(74) *Attorney, Agent, or Firm* — The Weintraub Group, P.L.C.

(57) ABSTRACT

A phosphor providing orange-yellow radiation is prepared from a cerium activated rare-earth garnet substrate that contains Li (lithium), Si (silicon), N (nitrogen) and F (fluorine) atoms, obtaining the overall stoichiometric equation of $(\Sigma Ln)_3Al_{5-x-y}Li_{y/3}Mg_{x/2}Si_{(x/2+2y/3)}F_{q/2}O_{12-q}N_{q/2}$. When the activating wavelength is 440~475 nm, the orange sub-energy band becomes 542~590 nm, and the radiation quatum ouput q>0.9, showing a cubic crystal garnet structure. The phosphor has color coordinate $\Sigma(x+y) \geq 0.89$, and color purity $\alpha \geq 0.89$. The invention also provides a warm white LED that has light intensity $J \geq 300$ cd, half open angle $2\theta \geq 60°$, luminous efficiency $65 \leq \zeta \leq 100$ lm/W, and color temperature within $2800 \leq T \leq 5500K$.

8 Claims, 2 Drawing Sheets

Spectroradiometric Analysis Report for Phosphor

Product : Y-221-a1-w-1520c-465nm-20ma
Manufacturer :
Client :
Sample No. :                          Date : Jan. 14, 2007
Tested By :                           Reviewed By :

Test Condition
Temperature :      °C                 RH : %
Ref. Gain : 64                        Spc. Gain : 8
Spectrum Range : 380-780 nm           Scan Step : 5 nm Spectroradiometric Parameters Spectral Distribution          CIE1931 Chromaticity Diagram Chromaticity Coordinates : x=0.4027 y=0.4557 u=0.2102 v=0.3568
Correlated Color Temperature : 3984 K
Brightness : 27726.5
Reference White : C Light              Peak Wavelenght : 569.5 nm
Dominant Wavelength : 571 nm           Bandwidth : 123.9 nm
Purity : 0.6225                        Radiant Brightness : 72.275
Color Ratio : Kr=46.0% Kg=36.0% Kb=18.0%
Rendering Index : Ra=66.7
R1=59    R2=74    R3=91    R4=58    R5=57    R6=65    R7=84    R8=45
R9=--55  R10=41   R11=50   R12=21   R13=64   R14=95   R15=49

FIG. 2

Spectroradiometric Analysis Report for Phosphor

Product : Y-221-a1-w-1520c-465nm-20ma
Manufacturer :
Client :
Sample No. :                                    Date : Jan. 14, 2007
Tested By :                                     Reviewed By :

Test Condition
Temperature :       °C                          RH : %
Ref. Gain : 64                                  Spe. Gain : 8
Spectrum Range : 380-780 nm                     Scan Step : 5 nm Spectroradiometric Parameters

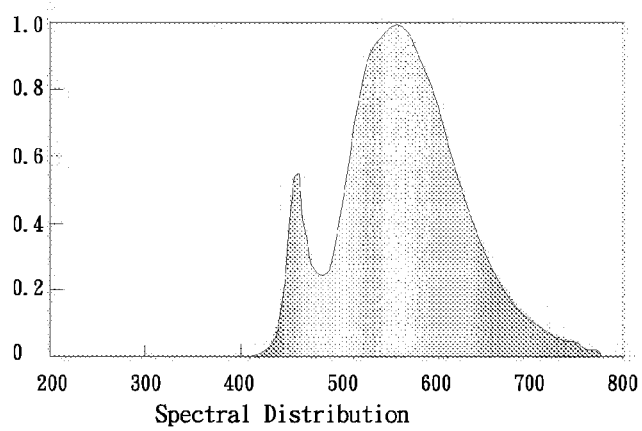
Spectral Distribution

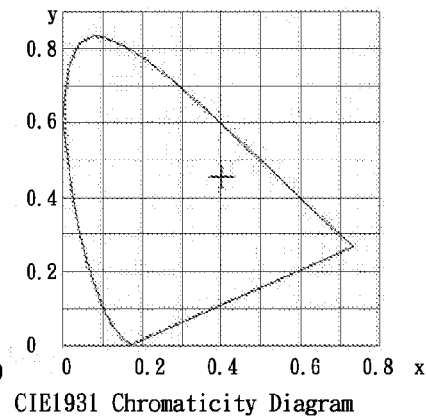
CIE1931 Chromaticity Diagram

Chromaticity Coordinates : x=0.4027 y=0.4557 u=0.2102 v=0.3568
Correlated Color Temperature : 3984 K
Brightness : 27726.5
Reference White : C Light                       Peak Wavelenght : 569.5 nm
Dominant Wavelength : 571 nm                    Bandwidth : 123.9 nm
Purity : 0.6225                                 Radiant Brightness : 72.275
Color Ratio : Kr=46.0%  Kg=36.0%  Kb=18.0%
Rendering Index : Ra=66.7
R1=59    R2=74    R3=91    R4=58    R5=57    R6=65    R7=84    R8=45
R9=-55   R10=41   R11=50   R12=21   R13=64   R14=95   R15=49

ORANGE-YELLOW PHOSPHOR AND WARM WHITE LED USING THE SAME

BACKGROUND OF THE INVENTION

1. Field of the Invention

The present invention relates to semiconductor light emitting technology and more particularly, to an InGaN warm white LED comprises a substrate prepared from a rare-earth garnet substrate and an activating agent prepared from cerium. Under the activation of the short-wave of InGaN, the warm white LED has the advantages of high luminous intensity, high luminous efficiency, and low temperature sensitivity.

2. Description of the Related Art

InGaN heterostructure (P-N junction) based semiconductor devices are intensively used in illumination and information technology. Various semiconductor-based multi-component, multi-color and high power luminous devices have been created and are intensively used in traffic transportation, resident houses, air ports, etc. Subject to the optical technical parameters, LED lamp surpasses conventional incandescent light sources in many fields. A booming development of LED lamp can be expected.

GaP/GaAs based LEDs are disclosed in page 480 of the book "Light Emitting Diode" (see world publication company, 1975, Russia). The book provides scientific information regarding the so-called two-element light emitting diode, i.e., heterostructure coated with phosphor to convert a primary radiation into a secondary radiation. In 1960~70, anti-Stokes phosphor was insensitively used to convert heterostructure near-infrared radiation into visible light (red, green or blue). Further, Russian Patent N635813, filing date Dec. 9, 1977) discloses bonding possibility of InGaN-based Stockes phosphor. This phosphor has a radiation wavelength greater than the excited wavelength.

The fast development in this field should be attributed to Nichia Suji Nakamura of Nichia Chemical, Japan. In 1997, S. Nakamura issued literatures regarding InGaN heterostructures. Based on this teaching, high-performance blue, purple and ultra-purple short-wave LEDs are created.

Based on early researches, experts created white light LED on the architecture of a blue InGaN heterostructure coated with inorganic yellow phosphor. This phosphor uses the famous YAG (yttrium aluminum garnet) substrate that has the formula $Y_3Al_5O_{12}$:Ce (see G. Blasse. Luminescence material. Amsterdam, N-Y. Pergamon 1994). This material is used as a yellow radiator in a two-element composite LED.

Conventional YAG has been intensively used. However, it still has drawbacks of (1) Insufficient quantum output $\zeta \leq 0.8$; (2) When $Gd^{+3}$ is introduced to substitute for a part of the yttrium in the garnet crystal lattice, the variation range of the radiation spectrum is limited; (3) Color saturation of the white radiation of the LED is insufficient, $Ra \leq 80$.

To eliminate the aforesaid drawbacks of the conventional phosphor, the inventor of the present invents a new phosphor (Taiwan Patent application no. 095149453, filed on Dec. 18, 2006). This new phosphor has $N^{-3}$ and $F^{-1}$ introduced therein. This patent also discloses an ideal preparation method so that the product provides high-brightness and highly saturated yellow light. When the luminous efficiency of the LED is high, the phosphor assures high luminous intensity. The prime model of this material has substantial advantages, however it still has the drawbacks of (1) Warm white light illumination cannot be reproduced, and (2) Color saturation of the overall white radiation of the LED is insufficient.

SUMMARY OF THE INVENTION

The present invention has been accomplished under the circumstances in view. It is therefore the main object of the present invention to provide an orange-yellow phosphor and warm white LED using the same, which eliminates the drawbacks of the prior art techniques.

It is another object of the present invention to provide an orange-yellow phosphor and warm white LED using the same, which has low sensitivity to temperature effect.

It is still another object of the present invention to provide an orange-yellow phosphor and warm white LED using the same, which has high performance, high luminous intensity, and high luminous efficiency.

To achieve these and other objects of the present invention, the orange-yellow phosphor comprises a substrate prepared from a rare-earth garnet and an activating agent prepared from cerium, wherein the host of the phosphor contains Li (lithium), Si (silicon), N (nitrogen) and F (fluorine) atoms, obtaining the overall stoichiometric equation of the phosphor substrate is: $(\Sigma Ln)_3 Al_{5-x-y} Li_{y/3} Mg_{x/2} Si_{(x/2+2y/3)} F_{q/2} O_{12-q} N_{q/2}$; when the activating wavelength is 440-475 nm, the orange sub-energy band becomes 542-590 nm, and the radiation quantum output q>0.9, showing a cubic crystal garnet structure.

Further, the chemical variation of index: $0.001 \leq x \leq 0.005$, $0.0001 < y < 0.0005$ and $0.0001 \leq q \leq 0.001$.

Further, the crystal lattice of cations of the composition of the phosphor has added thereto $\Sigma Ln$=yttrium, gadolinium, lutetium and cerium with the concentration of $[Y]=1-m-n-1$, wherein $0.005 \leq [Gd]=m \leq 0.2$, $0.005 \leq [Lu]=n \leq 0.05$, $0.005 \leq [Ce]=1 \leq 0.05$.

Further, when atomic fraction in the crystal lattice of anions of the phosphor $[Gd]=0.08$ and $[Lu]=0.02$, the unit lattice parameter is $\alpha=11.99$ Å, and at this time, the amount of the added nitrogen ions is $(N_o)_{q/2 \leq 0.008}$ atomic fraction.

Further, when the concentration of gadolinium is increased to $[Gd] \leq 0.1$ atomic fraction, the maximum value of the radiation spectrum of the phosphor is shifted to the long-wave zone; when $[Mg+Si] \leq 0.02$ atomic fraction, $\lambda=568~580$ nm.

Further, when $N^{-3}$ and $F^{-1}$ are introduced into the composition of the phosphor and the total amount $[N^{-3}+F^{-1}] \leq 0.005$ atomic fraction, the halfwave of the maximum value of the spectrum of the phosphor is $\Delta \lambda = 120~128$ nm.

Further, when Li, Mg, Si, N, F ions are introduced into the composition of the phosphor, the color coordinate of the radiation of the phosphor $\Sigma(x+y) \geq 0.89$.

Further, the phosphor has a yellow color and absorbs light $\lambda=440~480$ nm.

Further, the phosphor is made in the form of elliptical powder particles, having a particle medium diameter $d_{50}=3.5~5$ μm and lightproof gaps in the powder volume. The gaps have an average radius 6.68 Å.

Further, the phosphor has the surface thereof coated with a thin layer of nanopowdered zinc silicate substance composed of ZnO and $SiO_2$ at a concentration 40~80 nm.

To achieve these and other objects of the present invention, the warm white light emitting diode comprises a heterostructure substrate prepared from InGaN, and a phosphor prepared according to the present invention and covered on the surface of the InGaN heterostructure substrate. The phosphor is coated on the surface of the InGaN heterostructure substrate at an even concentration such that the radiation of light from the InGaN heterostructure substrate is mixed with the luminance of the phosphor to produce a warm white light of color coordinates $0.36 < x \leq 0.40$, $0.36 \leq y \leq 0.40$, having a color temperature within the range of $2800 \leq T \leq 5500K$.

The warm white light emitting diode further comprises a spherical cover lens covered on the phosphor, so that the radiation of the warm white light emitting diode has the light intensity $50 < 1 < 300$ cd, half open angle $2\theta = 60°$. When the excited state $U=3.5V$ and $J=20$ mA, the luminous efficiency of the warm white light emitting diode is $\zeta = 85 \sim 951$ m/W.

BRIEF DESCRIPTION OF THE DRAWINGS

FIG. 2 is a spectroradiometric analysis report for the present phosphor.

DETAILED DESCRIPTION OF THE PREFERRED EMBODIMENT

Figure 1:
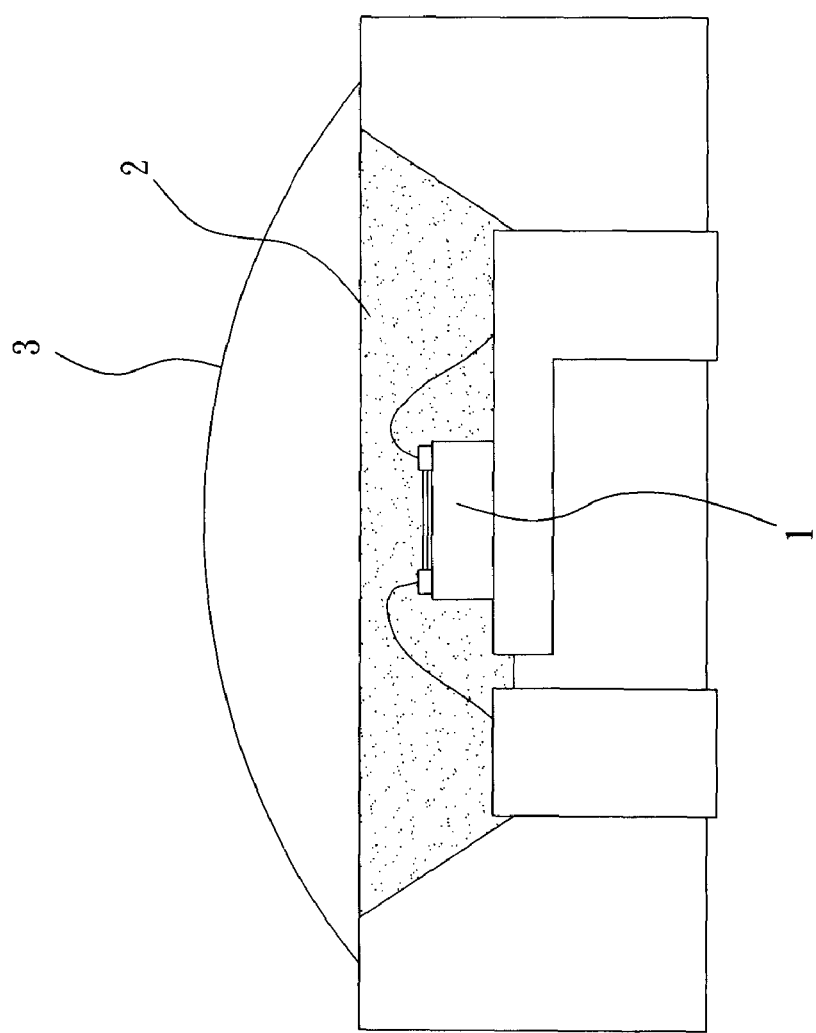
FIG. 1 a schematic structural view of a light emitting diode made according to the present invention.

The main object of the present invention is to eliminate the drawback of the aforesaid prior art phosphors. To achieve this object, the invention provides an orange-yellow phosphor for use in warm white LED. The phosphor uses a rare-earth garnet as the substrate and Cerium as the activating agent. The invention is characterized in that the phosphor has the substances of Li (lithium), Si (silicon), N (nitrogen) and F (fluorine) atoms contained therein; the overall stoichiometric equation of the phosphor substrate is: $(\Sigma Ln)_3 Al_{5-x-y} Li_{y/3} Mg_{x/2} Si_{(x/2+2y/3)} F_{q/2} O_{12-q} N_{q/2}$; when the activating wavelength is $440 \sim 475$ nm, the orange sub-energy band becomes $542 \sim 590$ nm, and the radiation quantum output $q > 0.9$, showing a cubic crystal garnet structure.

in which, the chemical variation of index: $0.001 \leq x \leq 0.005$, $0.0001 < y < 0.0005$ and $0.0001 \leq q \leq 0.001$;

in which, the crystal lattice of cations of the composition of the phosphor has added thereto $\Sigma Ln = Y$(yttrium), Gd(Gadolinium), Lu(Lutetium) and Ce(Cerium) with the concentration of Y to be $[Y]=1-m-n-1$, wherein $0.005 \leq [Gd] = m \leq 0.2$, $0.005 \leq [Lu] = n \leq 0.05$, $0.005 \leq [Ce] = 1 \leq 0.05$.

Hereinafter is a brief description about the substitute for the garnet phosphor in the crystal lattice of anions. At first, silicon ions were used to substitute for $Al+^{+3}$. and it was recorded as a defective model, for example, $(Si_{Al})°$. Magnesium was used to substitute for $Al^{+3}$, i.e., $(Mg_{Al})'$. These detective nodes were compensated by electric charges. The process was recorded: $(Al_{Al})_x = (mg_{Al})'_{x/2} + (Si_{Al})°_{x/2}$ (hereinafter referred to as Equation I). Other ions such as $Li^{+1}$, $N^{+3}$, $F^1$ were added to the crystal lattice of anions to produce a center and then recorded: $(O_o)_w = (N_o)'_{q/2} + (F_o)°_{q/2}$ (hereinafter referred to as Equation II); $(Al_{Al})_y = (Li_{Al})''_{y/3} + (Si_{Al})°_{2y/3}$ ((hereinafter referred to as Equation III). Equations I-3 are integrated, thereby obtaining $$(Al_{Al})_{x+y} + (O_o)_q = (Mg_{Al})'_{x/2} + (Si_{Al})°_{x/2} + (N_o)'_{q/2} + (F_o)°_{q/2} + (Li_{Al})''_{y/3} + (Si_{Al})°_{2y/3}$$

This integral equation indicates: by means of positive charges $(Si_{Al})°$ and/or $(F_o)°$ and negative charges $(Li_{Al})''$ and/or $(N_o)'$ and/or $(Mg_{Al})'$ in the defective model, the charges in the crystal lattice are balanced.

Analysis on spectrum examination and photoluminescent effect of every center of the prepared garnet phosphor was made. At first, we note that local static field enhancement in the garnet crystal lattice follows with adding of a small amount of $Si^{+4}$ to the location of $Al^{+3}$. $Si^{+4}$ has $\tau_{Si} = 0.5$ A, $Al^{+3}$ has $\tau_{Al} = 0.68$ A. Enhancement of electric field promotes increasing of the luminous intensity of $Ce^{+3}$ in the garnet crystal lattice. At the same time, it can be imaged, destruction of balance and replacement of a part of $Al^{+3}$ by $Si^{+4}$ cause widening of radiation spectrum and shifting of radiation spectrum toward red spectrum zone.

FIG. 2 shows the optical characteristics of the phosphor of the present invention that contains Li, Mg, Si, N and F. This phosphor has a wide range of radiation spectrum, $\Delta \lambda > 125$ nm. Further, the spectral characteristic shows the luminous maximum value is shifted to the long-wave zone. Normally, the maximum value is within $\lambda = 560 \sim 568$ nm. This shift facilitates radiation.

The aforesaid features are shown in the following phosphor prepared according to the present invention where: the crystal lattice of cations has added thereto $\Sigma Ln = Y$, Gd, Lu and Ce with the concentration of $[Y]=1-m-n-1$, in which $0.005 \leq [Gd]=m \leq 0.2$, $0.005 \leq [Lu]=n \leq 0.05$, $0.005 \leq [Ce]=1 \leq 0.05$.

The effects of these elements to the properties of the phosphor are described hereinafter. At first, Ce and the electronic transission its df determines the radiation of the material. Adding of Gd shifts the radiation spectrum to the long-wave zone within the range of $\Delta = 20 \sim 25$ nm. Adding of Lu atoms causes shift of short-wave activated spectrum of the phosphor from $\lambda = 435 \sim 450$ nm to the wavelength that increased by $\Delta = 10 \sim 15$ nm. It is for sure that adding [Lu] increases the luminous intensity of the phosphor, and the lattice parameter is reduced to be $\alpha \leq 12.01$ A. All these characteristics are shown in the phosphor of the present invention that is characterized: when atomic fraction in the crystal lattice of anions of the phosphor $[Gd]=0.08$ and $[Lu]=0.02$, the unit lattice parameter becomes $\alpha = 11.99$ A. At this time, the magnesium and silicon content in the initial batching is: $\Sigma(Mg+Si) \leq 0.025$ atomic fraction. Under this condition, initial content of nitrogen ions is $(N_o)_{p/2} \leq 0.008$ atomic fraction. It is to be understood that the chemical analysis of the elements added to the composition of the phosphor is complicated. Therefore, the invention indicated the initial concentration of impurity in the initial batching.

As stated, the spectral energy of the radiation of the phosphor prepared according to the present invention is shifted to the long-wave zone. This shift happens because of: (a) Gd ions and Y ions in the crystal lattice of cations are substituted to form a solid solution, and (b) the formation of the center defective substrate in the crystal lattice of anions is in conformity with the equation of $(Al_{Al})_x = (Mg_{Al})'_{x/2} + (Si_{Al})°_{x/2}$.

As stated above, shift of "gadolinium" is smoothly performed in a balanced manner subject to the centration of gadolinium added. On the other hand, replacement of aluminum ions by $Mg_{Al}$ and $Si_{Al}$ ions in the crystal lattice of anions causes transition shift of the maximum value of the radiation spectrum. The composition of the phosphor shows the characteristics that when the concentration of gadolinium increased to $[Gd] \geq 0.1$ atomic fraction, the maximum value of the radiation spectrum of the phosphor is shifted to the long-wave zone; when $[Mg+Si] > 0.02$ atomic fraction, $\lambda = 565 \sim 580$ nm. Therefore, the phosphor of the present invention has the advantages of: 1. Variation of radiation spectrum runs in a great range; 2. Excited spectrum changes toward the long-wave; and 3. Yellow rumination of the phosphor is highly stable.

Further, under specific conditions, the material of the present invention provides other benefits, for example, when $N^{-3}$ and $F^{-1}$ are introduced into the initial composition of the phosphor, and the total amount $[N^{-3}+F^{-1}] \leq 0.005$ atomic fraction, the halfwave of the maximum value of the spectrum of the phosphor is increased to $\Delta \lambda = 120 \sim 128$ nm. This composition assures durability of the phosphor, i.e., the phosphor does not change its optical properties during application. The phosphor prepared according to the present invention has the parameter that the radiation has a high color saturation, i.e., color purity. This parameter is determined subject to the ratio of the color ordinates X and Y and the total sum of the color coordinates of the radiation of the phosphor is: $X+Y \geq 0.86$. In most conditions, this value is $X+Y=0.89$.

As stated above, only the material containing Li, Mg, Si, N, F ions is added to the composition at the initial stage can achieve this high color purity value and total sum X+Y value. The preparation of the phosphor is done by means of a conventional solid phase synthesis.

Oxide composition is obtained from, for example, $Y_2O_3$, $Gd_2O_3$, $Lu_2O_3$ or $CeO_2$. It is to be understood that oxalate sediments of these compositions may be used. By means of adding γ-aluminum oxide, the specific surface of $\gamma Al_2O_3$ anion profile $S \geq 40 \times 10^3$ cm$^2$/cm$^3$. Halide fillers of lithium and magnesium, such as LiCl or LiF or LiBr, and $MgF_2$ and $MgCl_2$ or MgBr are introduced into the crystal lattice of anions. Introducing $Si^{+4}$ into the material assures the filler in the initial batching contains $SiO_2$. When "nanopowder" is used, the specific surface will be $100 \times 10^3$ cm$^2$/cm$^3$. The synthesis of the phosphor of the present invention is performed in a composite gas medium composed of 3-5% $H_2$ and 95-97% $N_2$. Examples of the preparation of the phosphor in accordance with the present invention are described hereinafter.

EXAMPLE I 15 g$Y_2O_3$, 6 g$Gd_2O_3$, 0.2 g$Lu_2O_3$ and 0.7 g$CeO_2$ were mixed in a high-speed mixer having the housing thereof coated with a layer of alloxide (alundum) coating. 22 g aluminum hydroxide, 2 g magnesium floride and 2 g magnesium barium floride were introduced into the batching. Supplementary solvent 0.2 g LiCl was introduced. After mixing, the batching was put in an alloxide crucible and then sent to a furnance under a weak pressure environment. The internal temperature of the furnance was increased to 1550° C. at the speed of 5 l/minute, and then the temperature was maintained for 4 hours. Thereafter, the furnance was cooled down to T=200° C., and then the product was taken out of the crucible, and then screened through a screen of 100 meshes and rinsed with HCl(1:1). Thereafter, the optical properties of the prepared product were measured using instrument "Sensing". Annex I indicates the data measured. The powder dispersion of the phosphor was also measured. It is to be understood that a standard requirement for powder dispersion of phosphor for two-element system LED has not yet been established. With respect to the point of view of using nanopowdered garnet phosphor to improve the luminous efficiency of the phosphor, no evidence data is assured. The average diameter of the powder particles was $d_{cp}=6\sim10$ μm. Requirement of powder dispersion is subject to the technique of the InGaN heterostructure surface phosphor. In this case, the dispersion $d_{cp}=113$ μm is necessary. By means of layering, phosphor having a relatively greater particle size is applicable.

This luminescent coating material assures LED luminous efficiency $\zeta=100$ lm/W. The material had the characteristics of strong yellow light and strong absorption of light within the range of $\lambda=440\sim480$ nm. Under this condition, the unit phosphor powder particles showed an elliptical shape, and an average diameter $d_{50}=3.5\sim5$ μm. Lightproof gaps were distributed over the periphery. These gaps extended to the whole volume of the phosphor. The average midline of radius of the gaps was 6.6847 Å.

The invention also discloses a warm white LED (light emitting diode). FIG. 1 illustrates the structure of the warm white LED. As illustrated, the warm white LED comprises substrate prepared from an InGaN heterostructure 1, and a phosphor 2 prepared from the aforesaid preparation method and covered on the surface of the InGaN heterostructure 1, wherein the phosphor 2 is covered on the surface of the InGaN heterostructure 1 at an even concentration such that the radiation of light from the InGaN heterostructure 1 is mixed with the luminance of the phosphor 2 to produce a warm white light of color coordinates $0.36 < x \leq 0.40$, $0.36 \leq y \leq 0.40$, having a color temperature within the range of $2800 \leq T \leq 5500K$.

The warm white LED further comprises a fixed spherical cover lens 3 covered on the phosphor 2, so that the radiation of the warm white LED has the light intensity $50 < I < 300$ cd, half open angle $2\theta=60°$. Under this condition, when the excited state U=3.5V and J=20 mA, the luminous efficiency of the LED is $\zeta=85\sim95$ lm/W.

The warm white LED further has a thin film of nanopowdered zinc silicate coating (not shown) coated on the surface of the phosphor 2. This thin film is composed of ZnO and $SiO_2$, and its thickness is 40~80 nm.

The above structure is explained hereinafter. At first, the phosphor has yellow color that shows excellent absoprtion power to absorb blue light from the InGaN heterostructure 1. The elliptical shape of the powder particles of the phosphor 2 constitutes a tight covering layer. Further, the tight covering layer of the phosphor 2 has gaps on the surface that do not admit light. The radius of these gaps is as small as $\tau=6.68$ Å. This value is about one half of the parent lattice parameter of the phosphor 2, i.e. a=11.99 Å. The lightproof crevices of the phosphor provide a further effect, i.e., they work as waveguide paths for optical radiation to cause oscillation in the powder substrate of the phosphor 2. It is for sure that increasing of the number of the gaps relatively increases the radiant intensity of the phosphor 2. By means of hydraulic nitrogen absorption of physical-chemical analysis (BET method) on the photoluminescent material prepared by the present invention, the lightproof gaps were measured. The analysis indicates that 1. when the gap radius is 6.07~9.80 Å, the total gap surface area is 2.07 m$^2$/g; 2. when the hydraulic, radius reaches the aforesaid value, the total gap volume is 0.001386 cm$^3$/g; 3. the average gap radius is 6.68 Å; and 4. the surface area of the powder is 4.56 m$^2$/g.

Therefore, the gap surface fraction is about 50% of the total surface area of the phosphor 2. This extraordinary characteristic of the phosphor 2 has never been discussed in prior art disclosures. Further, it is to be understood that the nanopowdered thin film that is coated on the surface of the phosphor 2 is composed of ZuO and $SiO_2$, having the thickness of 40~80 nm. This thin layer coating expels other ions, such as Na$^+$, K$^+$, Ce$^-$, $SO_4^{-2}$. During condensing and electrolysis, these ions are carried into the polymer syspension. Further, this zinc silicate thin film has sufficient conductivity so that storage of the phosphor 2 neither produces static charges nor causes an adhesion effect or agglomerated polymer. These characteristics determine the high quality of the LED. The LED in accordance with the present invention comprises an InGaN heterostructure 1. When made in a planar structure, the range of the straight lines of the radiation plane is 50~100 times greater than the heterostructure radiation prism geometric concentration. Under this condition, the surface and the radiation prism are coated with a polymeric coating having an evenly distributed concentration. In the volume, the concentration of the phosphor 2 is distributed from 1~15%. The concentration of the polymer coating is 60~120 μm. This thickness is sufficient to absorb 80% of the blue light radiated by the heterostructure and to convert the absorbed light into yellow light. At this time, the total luminous range has the warm white color coordinates of $0.34<x\leq0.42$ $0.35\leq y\leq0.42$, and the color temperature range T=5500–2800K.

Thus, the phosphor 2 of the present invention can be used for making a warm white LED that is unlike the well-known cold white light source. A lamp based on this warm white LED is practical for the purpose of illumination in houses, buildings, elevators, tunnels, etc. The luminescence of warm white light of the present invention comforts the eyes of human beings, creating a warm atmosphere in the houses where people live.

The LED prepared according to the present invention has a polycarbonate-based standard spherical cover lens 3, providing a radiation intensity $50\leq L\leq 300$ cd, a half open angle of $2\theta=600$, and a luminous efficiency $\zeta=85\sim 951$ lm/W. When electric current at the LED reaches 20~50 mA, the stated high luminous efficiency is obtained. When J=100 mA, the luminous efficiency is slightly lowered to $\zeta=65\sim 78$ lm/W. At this time, the experimental power in the device W=1 W is seen.

In conclusion, the warm white LED of the present invention uses a rare-earth garnet as the substrate and cerium as the activating agent. Under the short-wave activation of InGaN, the warm white LED has the characteristics of high luminous efficiency and low temperature sensitivity, thereby effectively improving the drawbacks of conventional phosphors.

Although particular embodiments of the invention have been described in detail for purposes of illustration, various modifications and enhancements may be made without departing from the spirit and scope of the invention.

What the invention claimed is:

1. A phosphor providing orange-yellow radiation for use in warm white LEDs (light emitting diodes), the phosphor comprising a substrate prepared from a rare-earth garnet and an activating agent prepared from cerium, wherein the substrate of the phosphor contains Li (lithium), Si (silicon), N (nitrogen) and F (fluorine) atoms, obtaining the overall stoichiometric equation of the phosphor substrate is: $(\Sigma Ln)_3Al_{5-x-y}Li_{y/3}Mg_{x/2}Si_{(x/2+2y/3)}F_{q/2}O_{12-q}N_{q/2}$; wherein the activating wavelength is 440~475 nm, the orange sub-energy band becomes 542~590 nm, and the radiation quantum output q>0.9, showing a cubic crystal garnet structure; and wherein the chemical variation of index is $0.001\leq x\leq 0.005$, $0.0001\leq y\leq 0.0005$ and $0.0001\leq q\leq 0.001$ and $\Sigma Ln$ is yttrium, lutetium, gadolinium, and cerium.

2. The phosphor as claimed in claim 1, wherein the $\Sigma Ln$ cations have a concentration of Y [Y]=1−m−n−1, and further wherein $0.005\leq [Gd]=m\leq 0.2$, $0.005\leq [Lu]=n\leq 0.05$, $0.005\leq [Ce]=1\leq 0.05$.

3. The phosphor as claimed in claim 1, wherein the atomic fraction in the crystal lattice of anions of the phosphor [Gd]=0.08 and [Lu]=0.02, the unit lattice parameter is $\alpha=11.99$ Å, and the amount of the added nitrogen ions is $(N_o)_{q/1}\leq 0.008$ atomic fraction.

4. The phosphor as claimed in claim 1, wherein the concentration of gadolinium is increased to $[Gd]\leq 0.1$ atomic fraction, the maximum value of the radiation spectrum of the phosphor is shifted to the long-wave zone; when $[Mg+Si]\leq 0.02$ atomic fraction, $\lambda=568\sim 580$ nm.

5. The phosphor as claimed in claim 1, wherein $N^{-3}$ and $F^{-1}$ are introduced into the composition of the phosphor and the total amount $[N^{-3}+F^{-1}]\leq 0.005$ atomic fraction, the halfwave of the maximum value of the spectrum of the phosphor is $\Delta\lambda=120\sim 128$ nm.

6. The phosphor as claimed in claim 1, wherein Li, Mg, Si, N, F ions are introduced into the composition of the phosphor, the color coordinate of the radiation of the phosphor $\Sigma(x+y)\geq 0.89$.

7. The phosphor as claimed in claim 1, which has a yellow color and absorbs light $\lambda=440\sim 480$ nm.

8. The phosphor as claimed in claim 1, having a thin layer coating of a nanopowder zinc silicate substance at a thickness of 40~80 nm.

* * * * *